United States Patent [19]

Plassmeier

[11] 4,363,105

[45] Dec. 7, 1982

[54] MICROCOMPUTER-CONTROLLED CIRCUIT TESTER

[75] Inventor: Horst Plassmeier, Herford, Fed. Rep. of Germany

[73] Assignee: Dürkoppwerke GmbH, Bielefeld, Fed. Rep. of Germany

[21] Appl. No.: 183,931

[22] Filed: Sep. 3, 1980

[30] Foreign Application Priority Data

Sep. 4, 1979 [DE] Fed. Rep. of Germany ....... 2935585

[51] Int. Cl.$^3$ .............................................. G05B 19/02

[52] U.S. Cl. ...................................... 364/580; 371/20; 324/73 R; 324/51; 364/579

[58] Field of Search ............... 364/480, 481, 482, 483, 364/579, 580, 200 MS File; 371/17, 20, 25; 324/73 R, 73 AT, 51, 52; 307/38, 116

[56] References Cited

U.S. PATENT DOCUMENTS

| | | | |
|---|---|---|---|
| 3,258,613 | 6/1966 | Felcheck | 307/38 |
| 3,590,370 | 6/1971 | Fleischer | 324/51 |
| 3,760,265 | 9/1973 | Hutch | 324/51 |
| 3,973,184 | 8/1976 | Raber | 324/51 |
| 4,245,319 | 1/1981 | Hedges | 307/38 |

OTHER PUBLICATIONS

Millman, J. and Halkais, C., *Integrated Electronics,* N.Y., McGraw-Hill, 1972, pp. 583–585.

*Primary Examiner*—Jerry Smith
*Assistant Examiner*—Michael R. Fleming
*Attorney, Agent, or Firm*—Karl F. Ross

[57] ABSTRACT

To test the integrity of a plurality of operating circuits each including a load energizable by an associated driver under the control of a microcomputer, a capacitor charged with unipolar pulsating test voltage is connected to a common terminal of all the operating circuits and concurrently therewith to the input of a trigger element whose threshold equals about half the peak amplitude of that voltage. During one or more brief intervals the microcomputer cuts in the driver of a selected circuit and senses the output voltage of the trigger element to determine whether or not the capacitor is being discharged through that circuit. A display device controlled by the microcomputer indicates the conductive or blocked state of the selected circuit as well as a possible malfunction manifesting itself in a discharge of the capacitor before any driver is turned on.

7 Claims, 5 Drawing Figures

MICROCOMPUTER-CONTROLLED CIRCUIT TESTER

FIELD OF THE INVENTION

My present invention relates to a system for the programmed control of a plurality of loads or output elements, such as solenoids, electromagnetic valves, heating coils and/or electric motors, whose operating circuits include respective drivers which are individually energizable in response to signals from a common computer.

BACKGROUND OF THE INVENTION

Electrically operated loads of this nature may be provided in large numbers in complex automated control systems such as, for example, a sewing-machine plant. Since a malfunction of a single operating circuit may affect large parts of the system, these circuits require frequent checking to ascertain possible irregularities.

Conventionally, such checking is done with the aid of voltmeters or ammeters to be connected across or inserted in a circuit suspected of being defective. The integrity or the defective condition of a circuit may be indicated visually or acoustically by means of lamps, buzzers or the like.

These conventional testing methods are relatively cumbersome and must be carried out by skilled personnel. They generally require a disconnection of the circuit element to be checked from the associated driver whose own performance, therefore, cannot be tested by such a procedure.

OBJECT OF THE INVENTION

Thus, the object of my present invention is to provide means in a computerized system of the above-discussed type for facilitating the checking of not only the various loads but also their drivers and the intervening connections with the aid of but a few external components and without requiring the disconnection of any circuit element to be tested.

SUMMARY OF THE INVENTION

I realize this object, in accordance with my present invention, by the provision of testing equipment comprising a source of test voltage connectable to a common terminal of all the operating circuits to be checked, that terminal lying in parallel with a measuring impedance preferably constituted by or including a capacitor. A voltage sensor connected across the measuring impedance detects the magnitude of a voltage difference developed thereacross, this sensor having an output connected to a computer (specifically a microcomputer in the embodiment more fully described hereinafter) which in normal operation serves to cut the various drivers in and out according to a given program. A selector connected to the computer can be set to identify a driver of an operating circuit to be checked, the computer thereupon activating the driver so identified whereby the voltage difference across the measuring impedance decreases when the selected operating circuit conducts. Such a decrease, or its absence, is signaled by the voltage sensor to the computer which actuates an indicator in response thereto for the purpose of registering the state of conduction of the selected operating circuit.

With a capacitive measuring impedance the source of test voltage is preferably a generator of unipolar pulses charging this capacitance through a unidirectionally conductive connection which may be part of a raw-rectification network included in that source. The sensor in this case advantageously comprises a trigger element of essentially binary character with a conduction threshold equal to a fraction of the peak amplitude of the pulsating voltage. When that voltage is low but the selected operating circuit is blocked, the capacitance does not discharge through that circuit but instead trips the trigger element which therefore sends a malfunction signal to the computer.

BRIEF DESCRIPTION OF THE DRAWING

The above and other features of my invention will now be described in detail with references to the accompanying drawing in which.

SPECIFIC DESCRIPTION

Figure 1:
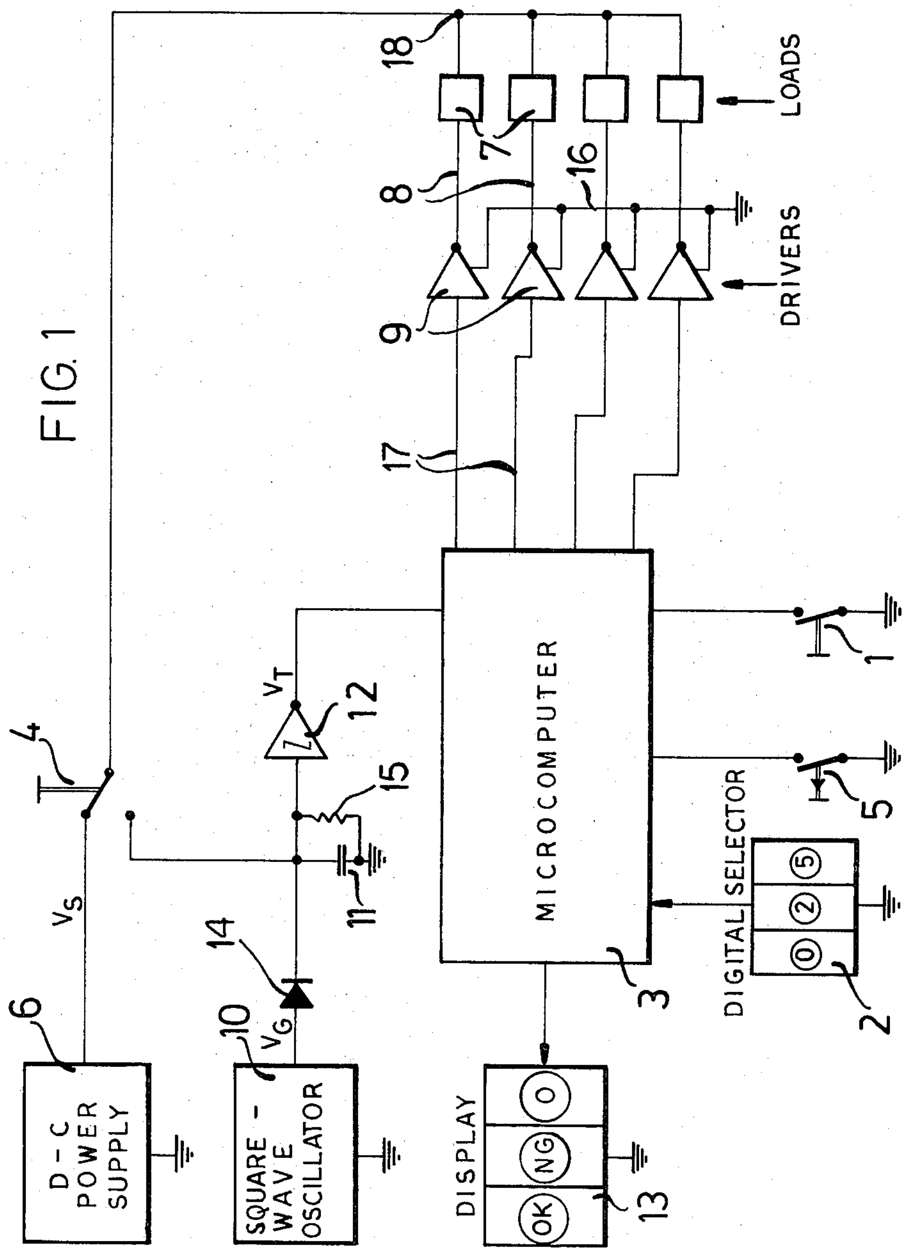
FIG. 1 is a block diagram of a microprogrammed control system according to my invention.

In FIG. 1 I have illustrated a plurality of output elements or loads 7 with respective operating circuits including lines 8 and associated drivers 9 here shown as inverting power amplifiers. These operating circuits have a common terminal 18 normally connected, via a switch 4, to a d-c power supply 6 generating a voltage $V_S$. A microcomputer 3 controls the several drivers 9 by way of respective output leads 17, their circuits being completed through a common ground lead 16. Thus, according to the program established by the microcomputer, drivers 9 are turned on at various times to energize the associated loads 7.

In accordance with my present invention, a square-wave generator 10 is connected via a diode 14 across an integrating capacitor 11 which is shunted by a high-ohmic resistor 15 and lies in the input of a trigger element 12 whose output extends to microcomputer 3. A reversal of switch 4 connects the common terminal 18 to the ungrounded terminal of capacitor 11 while disconnecting it from the output of source 6. A test switch 1, when closed, interrupts the normal program of the microcomputer and prepares it for the selective activation of any driver 9 whose address is fed in from a digital selector 2 here shown to have three decadic stages; the selection becomes effective upon closure of another switch 5 which may be a pushbutton. Microcomputer 3 has a further output extending to a display device 13 here shown to comprise three indicator lamps respectively labeled OK, NG and O.

The drivers (or their final stages) may consist, for example, of NPN transistors with collectors tied to lines 8, emitters grounded by lead 16 and bases connected to microcomputer outputs 17. Positive voltage on any of these output leads, therefore, will saturate the corresponding transistor 9 to energize the associated load 7 if the circuit 7–9 is intact.

Figure 3:
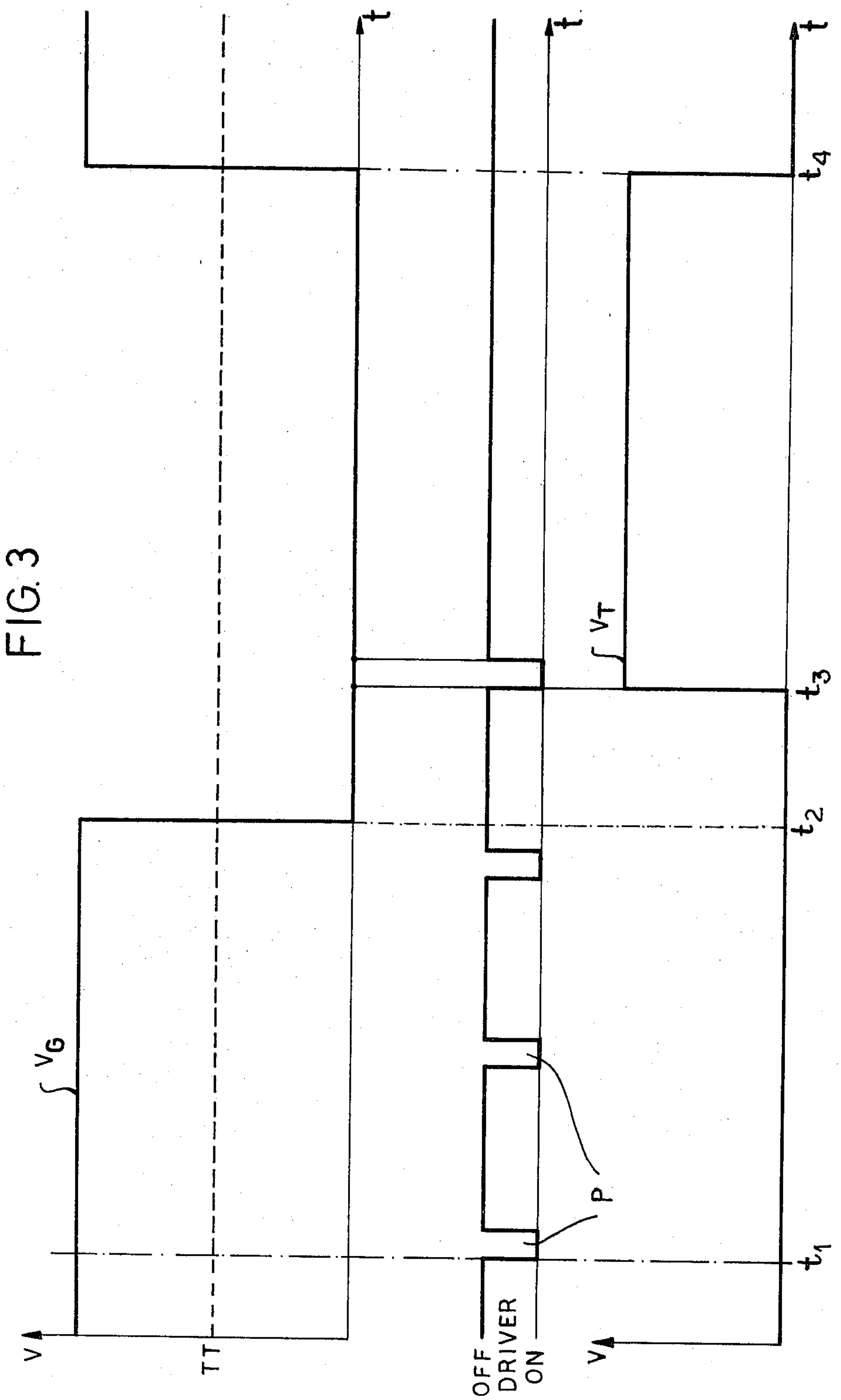
FIG. 3 is a set of graphs relating to the operation of the system of FIG. 1.

Trigger element 12 may be an inverting amplifier whose output voltage $V_T$ is high in the presence of an input voltage below its conduction threshold TT (FIG. 3) but drops when the amplifier saturates. With switch 4 in its illustrated normal position, capacitor 11 is charged by the test voltage $V_G$ of generator 10 to a potential above that threshold so that trigger voltage $V_T$ is low; with switches 1 and 5 open, however, voltage $V_T$ has no effect on the operation of the microcomputer. As shown in FIG. 3, threshold TT equals about half the generator voltage $V_G$ at its high level.

When it is desired to check the integrity of one or more operating circuits 7–9, switch 4 is reversed and switch 1 is closed. Since at this point the several drivers 9 are all presumably cut off, the capacitor 11 cannot discharge via terminal 18 so that trigger element 12 remains saturated and its output voltage $V_T$ is low. If this is not the case, i.e. if one of the drivers improperly conducts or a short circuit has developed in one of the operating circuits, the resulting discharge of the capacitor cuts off the trigger element 12 so that voltage $V_T$ rises to a point causing display lamp "O" to light. The defect must then be tracked down by other means before any integrity check can be initiated.

If no such defect is found to exist, the operator sets the digital selector 2 to identify the driver 9 of the operating circuit to be checked. Thereafter, depression of pushbutton 5 at an instant $t_1$ causes microcomputer 3 to emit one or more short pulses to the selected driver as indicated in the corresponding graph of FIG. 3. It will be noted that these activating pulses (shown to be of negative polarity) are very narrow, compared with their recurrence period which in turn is a minor fraction of a half-cycle of square wave $V_G$. As long as this square wave is in its positive half-cycle, the conduction of any operating circuit 7–9 in response to the activating pulses P on the corresponding lead 17 does not significantly lower the charge of capacitor 11 so that trigger element 12 retains its low output voltage.

After voltage $V_G$ has gone to zero at an instant $t_2$, the next pulse P (at instant $t_3$) causes the capacitor to discharge below the conduction threshold TT of trigger element 12 so that voltage $V_T$ goes high. In response to this signal from voltage sensor 12, microcomputer 3 lights the display lamp "OK" to show that the selected operating circuit is intact. At the same time, the microcomputer terminates the emission of pulses P on the selected lead 17 even if pushbutton 5 is still depressed. At the beginning of the next square-wave cycle, i.e. at an instant $t_4$, voltage $V_T$ returns to its previous low value.

If, however, the selected operating circuit is blocked for any reason, voltage $V_T$ remains low at instant $t_3$ and the microcomputer lights the lamp "NG" after a predetermined period corresponding to about a half-cycle of square wave $V_G$. The operator then recognizes the defective condition of the circuit to be checked and can take further measures to localize the malfunction, as by short-circuiting the corresponding load 7 and repeating the test through reoperation of pushbutton 5. With the exception of driver 9, all other elements present in that circuit could be similarly short-circuited to determine their integrity. Generator 10 is assumed to have a sufficiently high output impedance to tolerate any such short-circuiting. If indication "NG" changes to "OK" upon the short-circuiting of any element downstream of driver 9, that element will have to be replaced. If, on the other hand, the defect indication persists, the presumption is that the driver is at fault.

The brief duration of the activating pulses P emitted by microcomputer 3 is so chosen that the various loads 7 will not respond to them.

Figure 2:
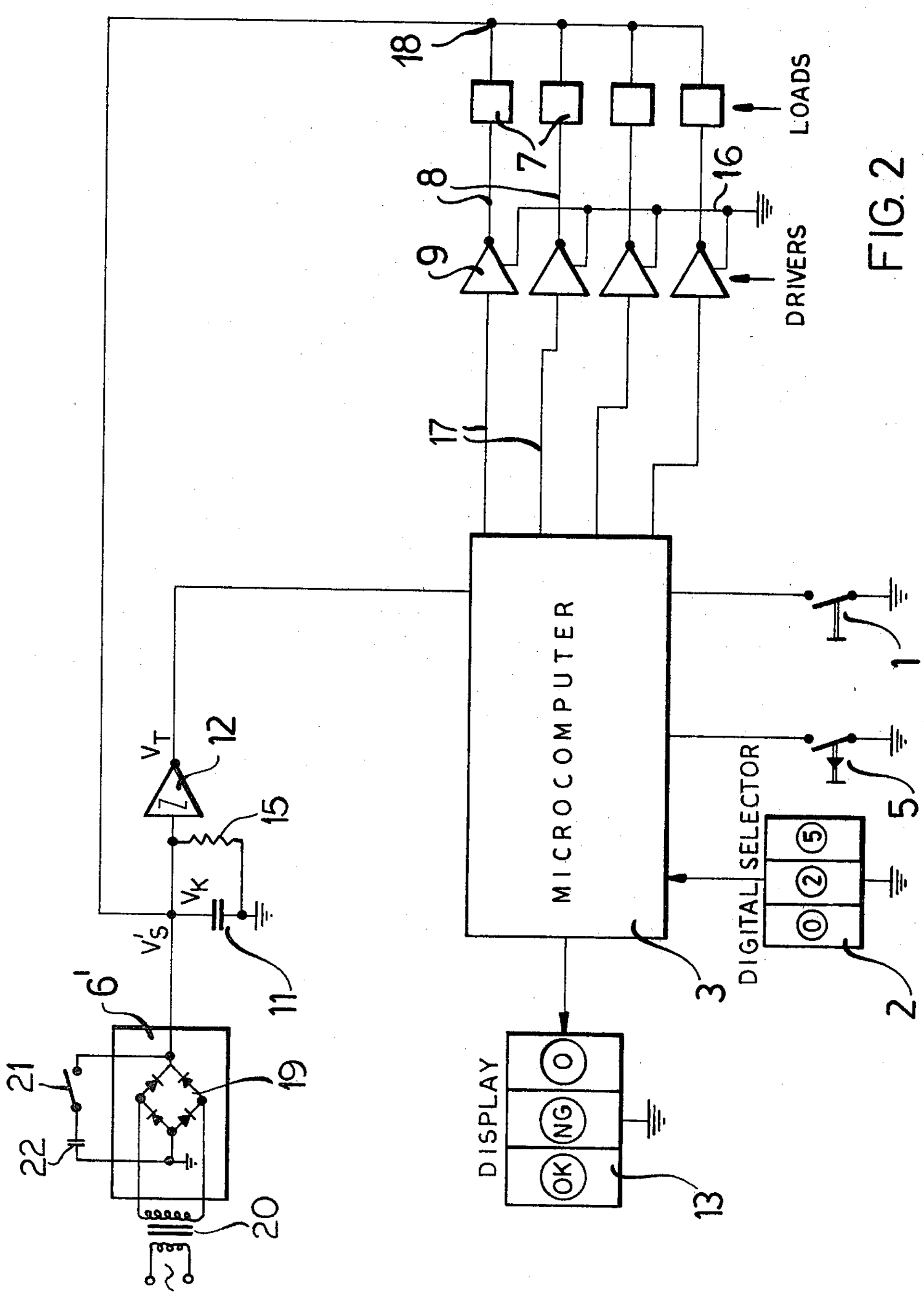
FIG. 2 is a block diagram similar to that of FIG. 1, illustrating a modification.
Figure 4:
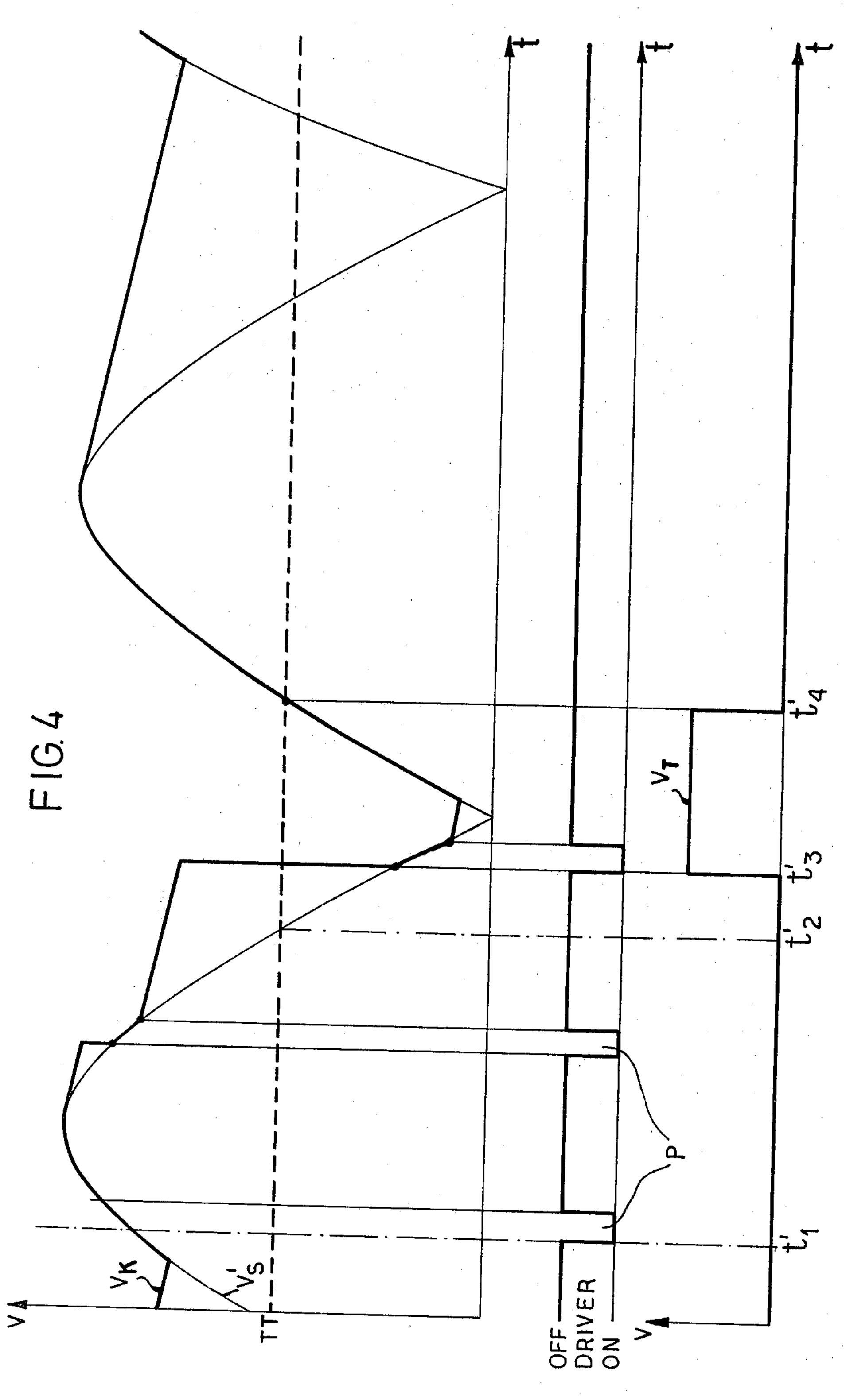
FIG. 4 is a set of graphs similar to FIG. 3 but relating to the modification of FIG. 2.

The modified system of FIG. 2 has a power source 6' comprising a full-wave rectifier 19 connected across the secondary of an input transformer 20. In normal operation, a switch 21 is closed to connect a smoothing capacitor 22 across the output diagonal of diode bridge 19 to provide a d-c supply voltage similar to voltage $V_S$ generated by source 6 of FIG. 1. With switch 21 open, as shown, source 6' generates a raw-rectified test voltage $V'_S$ with sinusoidal half-cycles as illustrated in FIG. 4. Source 6' is shown permanently connected across integrating network 11, 15 and thus also across the input of trigger element 12. The charge of capacitor 11 during normal operation depends therefore on the state of conduction of the several operating circuits 7–9, as does the trigger voltage $V_T$. With test switch 1 open, however, microcomputer 3 is unaffected by that voltage as already noted with reference to FIG. 1.

The threshold voltage TT of trigger element 12 is again chosen to be about half the maximum test voltage, i.e. of the peak amplitude of the sinusoidal pulses of voltage $V'_S$ as shown in FIG. 4 which also indicates the voltage $V_K$ of capacitor 11. In none of the drivers 9 conducts, capacitor voltage $V_K$ remains well above the threshold level TT of trigger element 12 whose output voltage $V_T$ is therefore practically zero. A significant rise of that output voltage upon closure of switch 1, but before operation of pushbutton 5, will thus again indicate a short circuit or an untimely conduction of a driver, causing lamp "O" to light.

If closure of switch 1 does not reveal such an abnormal condition, depression of pushbutton 5 at an instant $t'_1$ again gives rise to one or more activating pulses P on a selected output lead 17 of microcomputer 3. In the example represented by FIG. 4 this occurs, as in the case of FIG. 3, while the test voltage is high. Thus, several pulses P must be generated before voltage $V'_S$ has dropped below threshold level TT at an instant $t'_2$ so that the conduction of a selected driver 9 discharges the capacitor 11 sufficiently to give rise to a high trigger voltage $V_T$ at an instant $t'_3$. This high voltage level remains in effect only for a relatively short period, namely until an instant $t'_4$ when the pulsating voltage $V'_S$ again begins to exceed the threshold level TT. Thus, unless a suitable correlation exists between cycles of source 6' and the timing of pulses P, the spacing of these pulses should be substantially less than the interval $t'_2$–$t'_4$ between the mid-amplitude points of a descending and a subsequent ascending flank of test voltage $V'_S$.

The occurrence of high voltage $V_T$ again terminates the generation of pulses P and lights the lamp "OK" in display 13 whereas its absence causes a defect indication by energizing the lamp "NG". In the latter instance the operator may again bridge some circuit elements of the affected line 8 to determine whether or not they are at fault; a load 7, however, should not be short-circuited in this modified system since the internal resistance of source 6' is low. Thus, the particular load involved ought to be replaced by one known to be intact in order to ascertain whether the load or the driver is defective.

Figure 5:
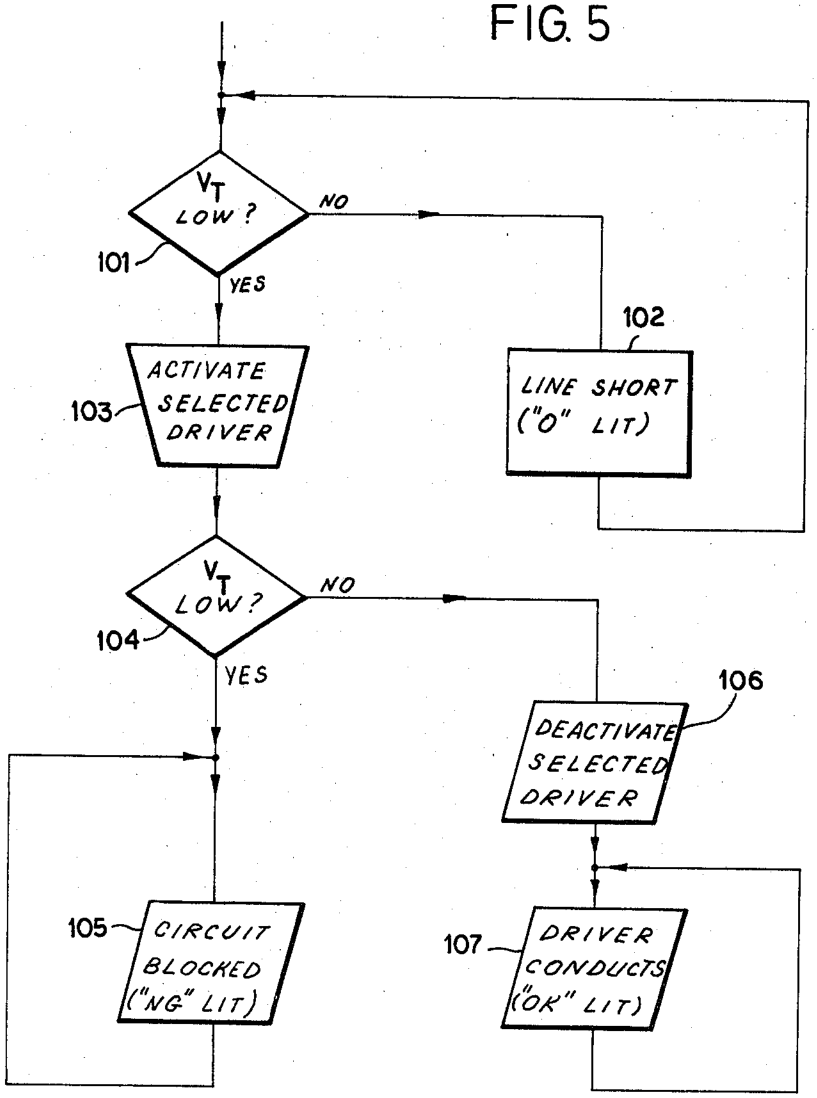
FIG. 5 is a flow chart of a microprogram executed by the system of FIG. 1 or 2.

FIG. 5 illustrates the microprogram implemented by the computer 3 of FIG. 1 or 2 in the aforedescribed testing procedure. Thus, closure of switch 1 results in an inquiry 101 regarding the high or low state of trigger voltage $V_T$. If that voltage is high, the microcomputer generates a command 102 for lighting the lamp "O" and the program is suspended until the defect is remedied. When this occurs and the recurrent inquiry 101 is answered by "$V_T$LOW", an instruction 103 appears (after closure of switch 5) to actuate the selected driver by the emission of one or more pulses P on the corresponding lead 17. This results in another inquiry 104, similar to inquiry 101, as to whether voltage $V_T$ is low. A positive answer in this instance brings about a command 105 to light the lamp "NG" with termination of the microprogram. If the answer to inquiry 104 is negative, an instruction 106 deactivates the selected driver by ending the emission of pulses P; this is followed by an instruction 107 for lighting the lamp "OK", thus ending the test program. The same can now be recommenced upon selection of another operating circuit.

If integrating network 11, 15 is replaced by a simple resistor, the system would operate only with a test voltage of substantially constant magnitude such as the supply voltage $V_S$ of FIG. 1. In such a case, however, the high level of trigger voltage $V_T$ indicative of the integrity of a selected operating circuit would persist only for a short period, substantially equaling the usually very brief duration of an activating pulse P, which might be insufficient for a proper response of the microcomputer 3.

I claim:

1. In a system for the programmed control of a plurality of loads provided with respective operating circuits including drivers individually associated therewith, and computer means for cutting said drivers in and out according to a given program, the combination therewith of testing equipment for individually checking the integrity of any of said operating circuits, said equipment comprising:

a generator of a pulsating unipolar test voltage connectable to a common terminal of said operating circuits in parallel with a capacitance chargeable by said generator through a unidirectionally conductive connection;

sensing means connected across said capacitance for detecting the magnitude of a voltage difference developed thereacross, said sensing means having an output connected to said computer means;

selector means, connected to said computer means, for identifying a driver of an operating circuit to be checked, said computer means being responsive to said selector means for activating the driver so identified whereby the voltage difference across said capacitance decreases upon conduction of the selected operating circuits;

switch means operable to cause said computer means to emit a series of brief activating pulses, of a duration insufficient to operate the associated load, to a driver identified by said selector means, said computer means being responsive to an output signal from said sensing means resulting from a significantly reduced capacitance charge to terminate the emission of said activating pulses; and indicating means operable by said computer means in response to an output signal from said sensing means to register the state of conduction of the selected circuit.

2. The combination defined in claim 1 or 2 wherein said sensing means comprises a trigger element with a conduction threshold equal to a fraction of the peak amplitude of said pulsating voltage.

3. The combination defined in claim 1 or 2 wherein said generator is a square-wave oscillator.

4. The combination defined in claim 1 or 2 wherein said generator comprises a raw-rectification network connected across a supply of alternating current.

5. The combination defined in claim 4 wherein said generator includes a smoothing capacitor connectable along said raw-rectification network for supplying said operating circuits with d-c voltage during nonoperation of said testing equipment.

6. The combination defined in claim 1 or 2 wherein said indicating means is operable to signal a malfunction upon a significant reduction of the capacitance charge prior to initiation of said series of activating pulses by said switch means.

7. The combination defined in claim 1 or 2 wherein said pulsating test voltage has a cycle length exceeding the spacing of said activating pulses.

* * * * *